(12) United States Patent
Blakeley et al.

(10) Patent No.: US 10,948,938 B2
(45) Date of Patent: *Mar. 16, 2021

(54) POWER MEASUREMENT IN A TWO-WIRE LOAD CONTROL DEVICE

(71) Applicant: Lutron Technology Company LLC, Coopersburg, PA (US)

(72) Inventors: Matthew Robert Blakeley, Macugnie, PA (US); William Zotter, Coopersburg, PA (US)

(73) Assignee: Lutron Technology Company LLC, Coopersburg, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/832,154

(22) Filed: Mar. 27, 2020

(65) Prior Publication Data

US 2020/0264646 A1    Aug. 20, 2020

Related U.S. Application Data

(63) Continuation of application No. 16/125,376, filed on Sep. 7, 2018, now Pat. No. 10,635,125, which is a
(Continued)

(51) Int. Cl.
*G05F 1/66* (2006.01)
*G06F 1/26* (2006.01)
(Continued)

(52) U.S. Cl.
CPC .............. *G05F 1/66* (2013.01); *G05B 15/02* (2013.01); *G05F 1/12* (2013.01); *G06F 1/26* (2013.01);
(Continued)

(58) Field of Classification Search
None
See application file for complete search history.

(56) References Cited

U.S. PATENT DOCUMENTS 4,399,395 A    8/1983    Espelage
4,435,677 A    3/1984    Thomas et al.
(Continued)

FOREIGN PATENT DOCUMENTS

CN        1456027 A    11/2003
CN      102378445 A     3/2012
(Continued)

*Primary Examiner* — Khaja Ahmad
(74) *Attorney, Agent, or Firm* — Condo Roccia Koptiw LLP

(57) ABSTRACT

A two-wire load control device may be configured to compute an accurate estimate of real-time power consumption by a load that is electrically connected to, and controlled by, the two-wire load control device. The load control device may be adapted to measure a voltage drop across the device during a first portion of a half-cycle of an AC waveform provided to the device. The device may be further configured to estimate a voltage drop across the load during the second portion of the half-cycle. The estimated voltage drop may be based on the measured voltage drop. The device may be further configured to measure a current supplied to the load during a second portion of the half-cycle. The device may be configured to estimate power consumed by the load based on the measured current and the estimated voltage drop.

20 Claims, 8 Drawing Sheets

Related U.S. Application Data continuation of application No. 14/991,133, filed on Jan. 8, 2016, now Pat. No. 10,082,815, which is a continuation of application No. 13/793,308, filed on Mar. 11, 2013, now Pat. No. 9,250,669.

(60) Provisional application No. 61/700,951, filed on Sep. 14, 2012.

(51) Int. Cl.
    *H05B 39/04*     (2006.01)
    *H05B 47/175*     (2020.01)
    *G05B 15/02*     (2006.01)
    *G05F 1/12*     (2006.01)
    *G01R 21/133*     (2006.01)

(52) U.S. Cl.
    CPC ........... *H05B 39/04* (2013.01); *H05B 47/175* (2020.01); *G01R 21/133* (2013.01); *Y02B 20/00* (2013.01)

(56) References Cited

U.S. PATENT DOCUMENTS

| | | | |
|---|---|---|---|
| 4,661,765 A | 4/1987 | Bando et al. | |
| 5,430,356 A | 7/1995 | Ference et al. | |
| 5,629,607 A | 5/1997 | Callahan et al. | |
| 5,672,941 A | 9/1997 | Callahan et al. | |
| 5,754,036 A | 5/1998 | Walker et al. | |
| 5,821,703 A | 10/1998 | Callahan et al. | |
| 5,834,907 A | 11/1998 | Takehara et al. | |
| 5,872,429 A | 2/1999 | Xia et al. | |
| 6,091,205 A | 7/2000 | Newman, Jr. et al. | |
| 6,118,680 A | 9/2000 | Wallace et al. | |
| 6,359,266 B2 | 3/2002 | Little et al. | |
| 6,380,692 B1 | 4/2002 | Newman, Jr. et al. | |
| 6,501,234 B2 | 12/2002 | Lin et al. | |
| 6,528,957 B1 | 3/2003 | Luchaco | |
| 7,019,469 B1 | 3/2006 | Thurk et al. | |
| 7,259,524 B2 | 8/2007 | Hausman, Jr. et al. | |
| 7,619,365 B2 | 11/2009 | Davis et al. | |
| 7,847,440 B2 | 12/2010 | Mosebrook et al. | |
| 8,185,333 B2 | 5/2012 | Jonsson et al. | |
| 8,193,787 B2 | 6/2012 | Valenti et al. | |
| 8,212,424 B2 | 7/2012 | Mosebrook et al. | |
| 8,461,723 B2 | 6/2013 | Kojima et al. | |
| 8,559,972 B2 | 10/2013 | Patel et al. | |
| 8,569,956 B2 | 10/2013 | Dreyer et al. | |
| 8,576,589 B2 | 11/2013 | Melanson et al. | |
| 8,614,595 B2 | 12/2013 | Acatrinei et al. | |
| 8,664,889 B2 | 3/2014 | Newman, Jr. et al. | |
| 8,729,814 B2 | 5/2014 | Salvestrini et al. | |
| 8,941,316 B2 | 1/2015 | Melanson et al. | |
| 8,957,662 B2 | 2/2015 | Newman, Jr. et al. | |
| 9,155,162 B2 | 10/2015 | Zotter et al. | |
| 9,250,669 B2 | 2/2016 | Blakeley et al. | |
| 9,544,977 B2 | 1/2017 | Economy et al. | |
| 9,553,451 B2 | 1/2017 | Zacharchuk et al. | |
| 9,674,933 B2 | 6/2017 | Zotter et al. | |
| 9,736,911 B2 | 8/2017 | Spira et al. | |
| 2006/0255746 A1* | 11/2006 | Kumar ................. H05B 39/044 315/209 R |
| 2006/0267515 A1 | 11/2006 | Burke et al. | |
| 2007/0001654 A1 | 1/2007 | Newman, Jr. | |
| 2007/0188110 A1 | 8/2007 | Ger et al. | |
| 2008/0007187 A1 | 1/2008 | Zomorrodi et al. | |
| 2009/0077405 A1 | 3/2009 | Johansen et al. | |
| 2009/0108765 A1 | 4/2009 | Weightman et al. | |
| 2009/0261758 A1 | 10/2009 | Ger et al. | |
| 2009/0273958 A1* | 11/2009 | Baby ................. H02M 7/2176 363/127 |
| 2009/0315400 A1 | 12/2009 | Howe et al. | |
| 2010/0141158 A1* | 6/2010 | Newman, Jr. ........ H05B 39/045 315/182 |
| 2010/0164579 A1 | 7/2010 | Acatrinei et al. | |
| 2010/0270982 A1 | 10/2010 | Hausman, Jr. et al. | |
| 2011/0068704 A1 | 3/2011 | McKinney et al. | |
| 2011/0121752 A1* | 5/2011 | Newman, Jr. .......... H05B 45/10 315/291 |
| 2011/0153246 A1 | 6/2011 | Donaldson et al. | |
| 2011/0162946 A1 | 7/2011 | Altonen et al. | |
| 2011/0248640 A1 | 10/2011 | Welten et al. | |
| 2011/0291735 A1 | 12/2011 | Thirugnanasambandham et al. | |
| 2012/0043900 A1 | 2/2012 | Chitta et al. | |
| 2012/0043913 A1 | 2/2012 | Melanson et al. | |
| 2012/0098505 A1 | 4/2012 | Irissou et al. | |
| 2012/0098516 A1 | 4/2012 | Snelten et al. | |
| 2012/0146526 A1 | 6/2012 | Lam et al. | |
| 2012/0268020 A1 | 10/2012 | Newman, Jr. et al. | |
| 2012/0281444 A1 | 11/2012 | Dent et al. | |
| 2013/0154504 A1 | 6/2013 | Hick et al. | |
| 2013/0187563 A1 | 7/2013 | Sasai et al. | |
| 2013/0300301 A1 | 11/2013 | Miyahara et al. | |
| 2014/0077718 A1 | 3/2014 | Zotter et al. | |

FOREIGN PATENT DOCUMENTS

| | | |
|---|---|---|
| CN | 102934522 A | 2/2013 |
| EP | 1018208 A1 | 7/2000 |
| EP | 2654379 A1 | 10/2013 |
| WO | 2002-056643 A1 | 7/2002 |
| WO | 2012081350 A1 | 6/2012 |

\* cited by examiner

POWER MEASUREMENT IN A TWO-WIRE LOAD CONTROL DEVICE

CROSS-REFERENCE TO RELATED APPLICATIONS

This application is a continuation of U.S. application Ser. No. 16/125,376, filed on Sep. 7, 2018, which is a continuation of U.S. application Ser. No. 14/991,133, filed on Jan. 8, 2016, now U.S. Pat. No. 10,082,815, issued on Sep. 25, 2018, which is a continuation of U.S. application Ser. No. 13/793,308, filed on Mar. 11, 2013, now U.S. Pat. No. 9,250,669, issued on Feb. 2, 2016, which claims the benefit of U.S. Provisional Application No. 61/700,951, filed on Sep. 14, 2012, both of which are incorporated by reference in their entirety.

BACKGROUND

Many utility providers are now deploying "smart grid" technologies into respective portions of the power grid. Smart grid technologies may enhance the respective abilities of utility providers and their consumers to communicate with each other and to decide how and when electrical energy should be produced or consumed.

Some smart grid applications may enable time-based electricity pricing. For example, a consumer who typically pays a fixed rate per kilowatt-hour (kWh) may configure an appliance equipped with a smart grid application, e.g., to set an electricity usage threshold for the appliance or to adjust the appliance's electricity usage behavior, to take advantage of fluctuating prices. Additionally, smart grid applications may enhance opportunities for demand response, e.g., by providing real time power consumption data to electricity producers or consumers. An example of providing real time power consumption data includes measuring the power consumption of a load at one or more respective points in time over a given interval, averaging the power consumption values measured during the interval, and providing the averaged power consumption as the real time power consumption of the load.

Smart grid applications may require the use of an energy management system (EMS) to provide automated control and/or monitoring of electricity-consuming devices, such as lighting, appliances, etc. An EMS may collect electricity usage data, such as power consumption data, from the devices, and may use that data to perform self-diagnostic and optimization routines, to perform trend analysis, to generate annual consumption forecasts, and the like.

Load control devices, such as electronic switches and dimmers, may be used to control the amount of power delivered from an alternating current (AC) source to a load that consumes the power. Such a load control device can be configured to calculate an amount of power consumed by a load. The power consumption data may be communicated from the load control device to an EMS or a user of the load control device.

FIG. 1A depicts an example load control system 100 that includes a three-wire load control device 104. The three-wire load control device 104 may be electrically connected between an AC source 108 and a load 110. The three-wire load control device 104 may be operable to control an amount of power delivered from the AC source 108 to the load 110. The load 110 may be a lighting load, for example, or any other electrical load.

The three-wire load control device 104 may be an electronic switch or dimmer for example. The three-wire load control device 104 may include a controllably conductive device, such as a thyristor (e.g., a triac), operable to control an amount of power delivered from the AC source 108 to the load 110. The three-wire load control device 104 may be connected to the AC source 108 by a first wire 112, to the load 110 by a second wire 114, and to an electrical path between the load 110 and a return side of the AC source 108 by a third wire 116. The first wire 112 may be referred to as a hot wire, the second wire 114 may be referred to as a switched-hot or dimmed-hot wire, and the third wire 116 may be referred to as a neutral wire.

The controllably conductive device (not shown) may operate in respective non-conductive and conductive states within respective portions of each half-cycle of an AC waveform provided by the AC source. The controllably conductive device may be switched from the non-conductive to the conductive state in response to a triggering signal. In a forward phase control system, generation of a triggering signal may be synchronized with the AC line voltage such that the triggering signal is generated at a certain time after a zero crossing is detected. Responsive to the triggering signal, a gate of the controllably conductive device may be energized, causing the controllably conductive device to operate in the conductive state for the remainder of the AC half-cycle.

During the time interval between the zero crossing and the gate triggering, the controllably conductive device may operate in the non-conductive state. When the controllably conductive device is operating in the non-conductive state, effectively no power is supplied to the load. The load control device may be configured to allow for alteration of the time interval, such as in response to adjustment of a user-operable control (e.g., a dimming knob or a slider) or in response to changes in a dimming level signal. Altering the time interval between the zero crossing and the gate triggering (and, thereby affecting the conduction angle of the controllably conductive device) affects the root-mean-square (RMS) power delivered to the load 110. See, for example, commonly-assigned U.S. Pat. No. 5,430,356, entitled "Programmable Lighting Control System With Normalized Dimming For Different Light Sources," the entire disclosure of which is incorporated herein by reference. Thus, the controllably conductive device may be switched to affect the AC voltage waveform provided to the load 110, thereby controlling the power delivered to the load.

The three-wire load control device 104 has three AC waveforms available to it: an AC input voltage waveform 118, which may be measured between the first wire 112 and the third wire 116; an AC device voltage waveform 120, which may be measured between the first wire 112 and the second wire 114; and an AC load voltage waveform 122, which may be measured between the second wire 114 and the third wire 116.

Because the three-wire load control device 104 always has the AC load voltage waveform 122 available to it, the three-wire load control device 104 can be configured to compute power consumed by the load 110 over a given time interval. Power consumed by the load 110 may be determined by multiplying the voltage drop across the load 110 by the current flowing through the load 110. The three-wire load control device 104 can be configured to measure the current it supplies to the load 110 during any given time interval. And, because the three-wire load control device 104 has the AC load voltage waveform available 122 to it, it can also be configured to determine the voltage drop across the load 110 during any given time interval. Thus, because the three-wire load control device 104 always has available to it both the current supplied to the load 110 and voltage dropped across the load 110, the three-wire load control device 104 can be configured to compute power consumed by the load 110 over any given time interval.

FIG. 1B depicts an example load control system 102 that includes a two-wire load control device 106. The two-wire load control device 106 may be electrically connected between an AC power source 108 and a load 110. The two-wire load control device 106 may be operable to control an amount of delivered from the AC source 108 to the load 110.

The two-wire load control device 106 may be an electronic switch or dimmer for example. The two-wire load control device 106 may include a controllably conductive device, such as a thyristor (e.g., a triac), operable to control an amount of power delivered from the AC power source 108 to the load 110. The two-wire load control device 106 may be connected to the AC power source 108 by a first wire 112 and to the load 110 by a second wire 114. The first wire 112 may be referred to as a hot wire. The second wire 114 may be referred to as a switched-hot or dimmed-hot wire. As described above, the controllably conductive device (not shown) may operate in respective non-conductive and conductive states within respective portions of each half-cycle of an AC input voltage waveform provided by the AC power source.

Unlike the three-wire load control device 104 described above, the two-wire load control device 106 does not have the AC load voltage waveform 122 available to it. Accordingly, the two-wire load control device 106 cannot be configured to determine the actual voltage drop across the load 110. Consequently, the two-wire load control device 106 cannot be configured to compute the actual power consumed by the load 110 over any given time interval by merely multiplying the actual voltage drop across the load by the actual current flowing through the load during the given time interval. It would be desirable if there were available a two-wire load control device capable of computing and reporting an accurate estimate of real-time power consumption of a corresponding load.

SUMMARY

A two-wire lighting control device may be configured to control an amount of power delivered from an alternating current (AC) power source to a lighting load. The lighting control device may include a controllably conductive device that is configured to be coupled in series electrical connection between the AC power source and the lighting load. The lighting control device may include a control circuit that is configured to render the controllably conductive device non-conductive during a first portion of a half-cycle of an AC waveform and render the controllably conductive device conductive during a second portion of the half-cycle to control the amount of power delivered to the lighting load. The lighting control device may include a voltage measuring circuit that measures a voltage across the two-wire load control device during the first portion of the half-cycle. The lighting control device may include a signal generator that generates a complementary voltage waveform that approximates a voltage across the load during the second portion of the half-cycle, wherein the complementary voltage waveform is based on the voltage measured across the two-wire lighting control device during the first portion of the half-cycle. The lighting control device may include a current measuring circuit that measures a current supplied to the lighting load from the two-wire lighting control device during the second portion of the half-cycle. The control circuit may compute an estimated amount of power consumed by the lighting load based on the complementary voltage waveform and the current supplied to the lighting load during the second portion of the half-cycle.

A two-wire lighting control device for controlling an amount of power delivered from an alternating current (AC) power source to an electrical load. The lighting control device may include a controllably conductive device that is configured to be coupled in series electrical connection between the AC power source and the lighting load. The lighting control device may include a control circuit that is configured to control the amount of power delivered to the lighting load by rendering the controllably conductive device non-conductive during a first portion of a half-cycle of an AC waveform and rendering the controllably conductive device conductive during a second portion of the half-cycle. The lighting control device may include a control circuit adapted to measure a voltage across the two-wire lighting control device during a first portion of the half-cycle. The control circuit may be adapted to compute an estimated voltage across the lighting load during a second portion of the half-cycle based on the voltage measured across the two-wire lighting control device during the first portion of the half-cycle. The control circuit may be adapted to measure a current supplied to the lighting load during the second portion of the half-cycle. The control circuit may be adapted to compute, based on the estimated voltage and the measured current, an estimated power consumed by the lighting load during the second portion of the half-cycle.

A method may estimate power consumption of a lighting load using a two-wire lighting control device. The lighting control device may be configured to control an amount of power delivered from an alternative current (AC) power source to the lighting load. The lighting control device may have a controllably conductive device that is configured to operate in a non-conductive state during a first portion of a half-cycle of an AC waveform and in a conductive state during a second portion of the half-cycle. The method may include measuring a voltage across the two-wire lighting control device during the first portion of the half-cycle. The method may include generating a complementary voltage waveform that approximates a voltage across the lighting load during the second portion of the half-cycle, wherein the complementary voltage waveform is based on the voltage measured across the two-wire lighting control device during the first portion of the half-cycle. The method may include measuring a current supplied to the lighting load from the two-wire lighting control device during the second portion of the half-cycle. The method may include computing an estimated amount of power consumed by the lighting load based on the complementary voltage waveform and the current supplied to the lighting load during the second portion of the half-cycle.

DETAILED DESCRIPTION

Figure 1A:
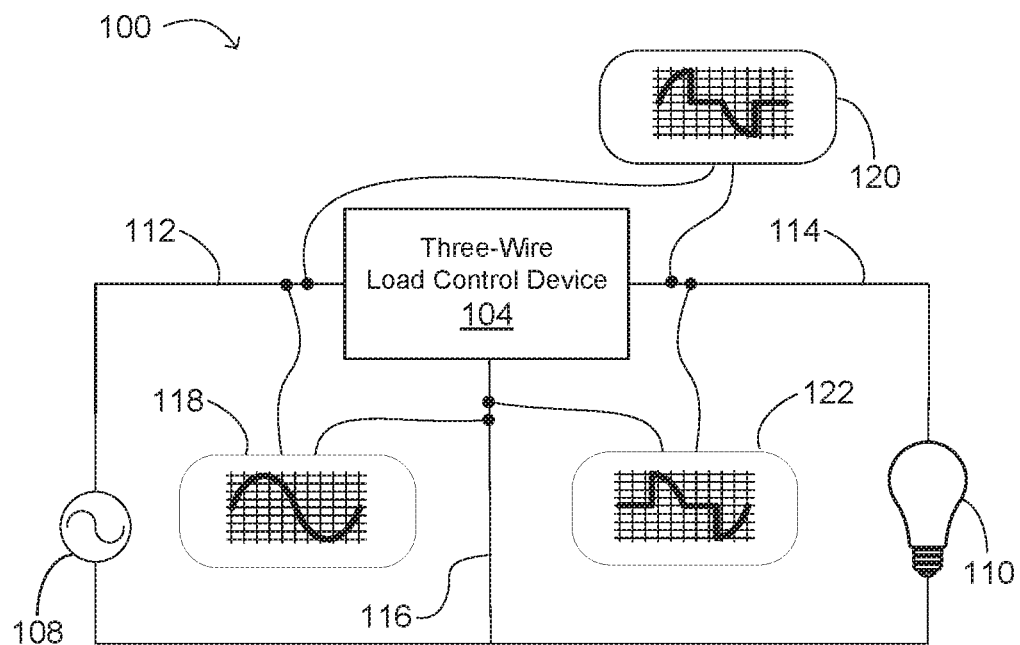
FIG. 1A depicts an example load control system that includes a three-wire load control device.
Figure 1B:
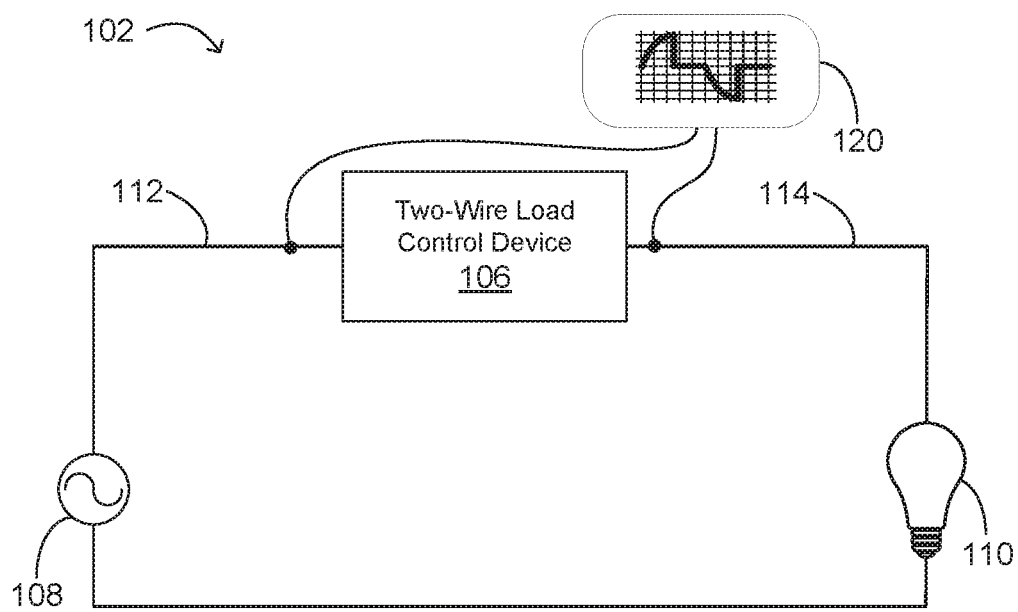
FIG. 1B depicts an example load control system that includes a two-wire load control device.
Figure 2A:
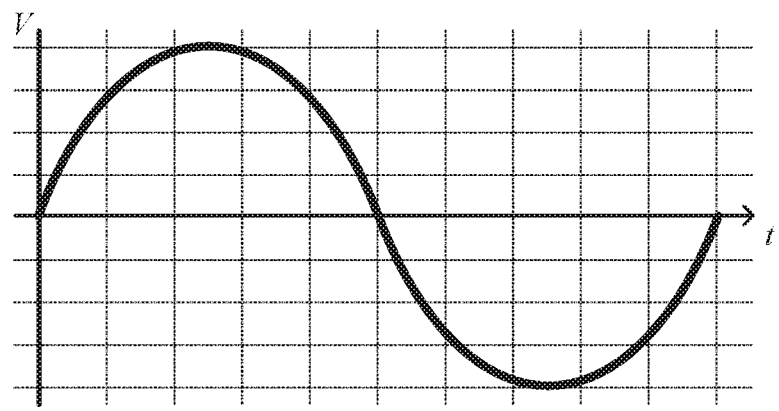
FIGS. 2A-2D depict example waveforms representing voltage across the two-wire load control device in a forward-phase-control dimming system.

FIGS. 2A-2D depict example phase-control waveforms representing voltage across a two-wire load control device (e.g., two-wire load control device 502 shown in FIG. 5) in a forward-phase-control dimming system. The two-wire load control device includes a controllably conductive device that operates in a non-conductive state during a first portion of a half-cycle of an alternating current (AC) waveform provided to the device, and in a conductive state during a second portion of the half-cycle. As shown in FIG. 2A, when the controllably conductive device is in a non-conductive state for the entire half-cycle (i.e., when the first portion has a duration equal to that of the entire half-cycle, and the second portion has a duration of zero), the AC line voltage is dropped across the load control device 106 for the entire half-cycle.

Figure 2B:
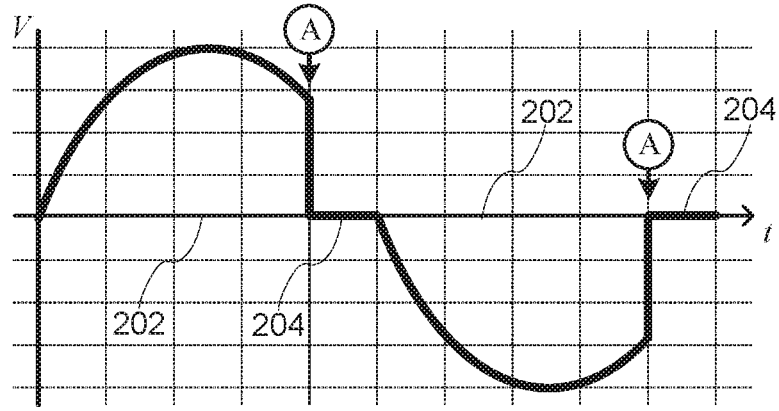
Figure 2C:
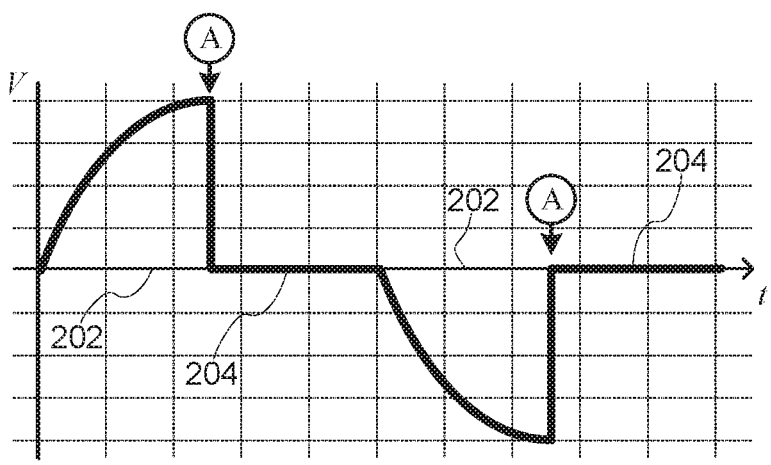
Figure 2D:
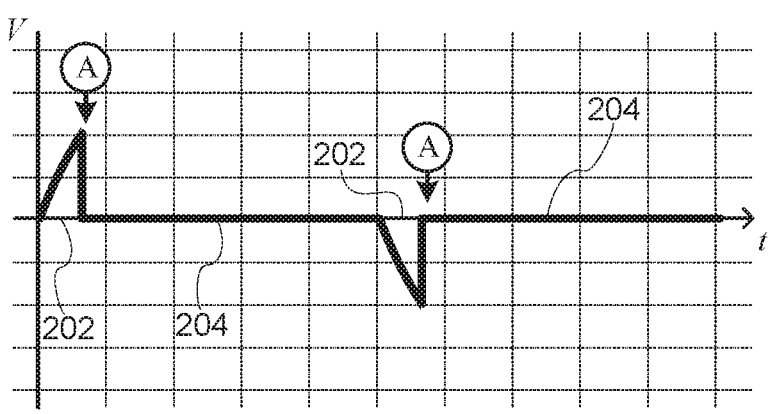
Figure 3A:
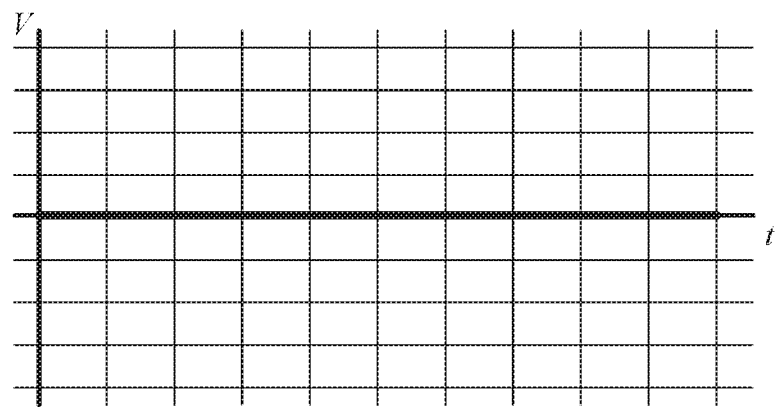
FIGS. 3A-3D depict example waveforms representing voltage across the corresponding load in a forward-phase-control dimming system.
Figure 3B:
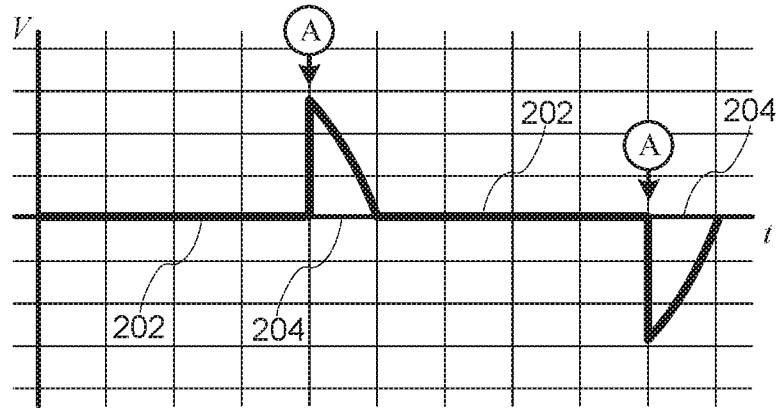
Figure 3C:
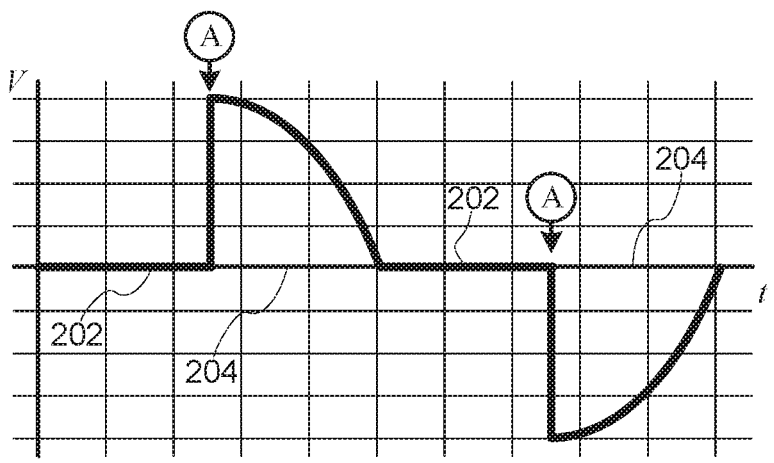
Figure 3D:
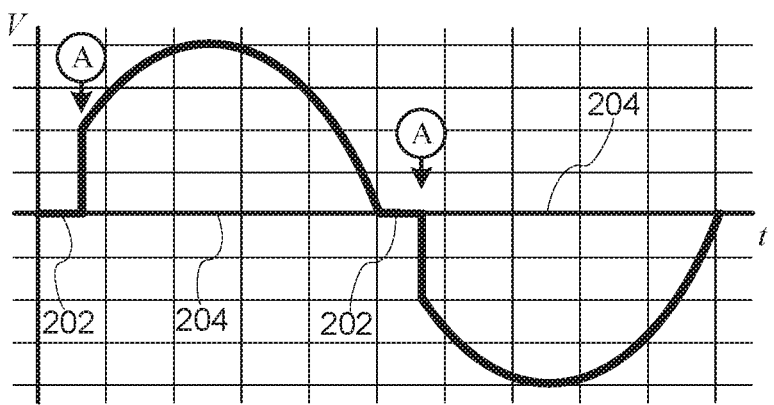
Figure 4A:
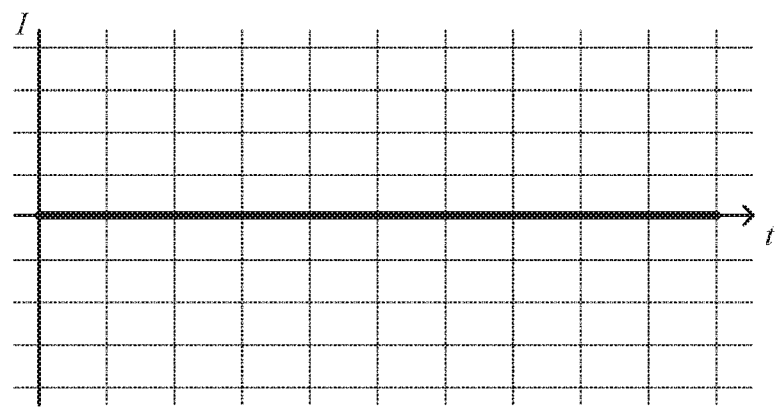
FIGS. 4A-4D depict example waveforms representing current supplied to the load in a forward-phase-control dimming system.
Figure 4B:
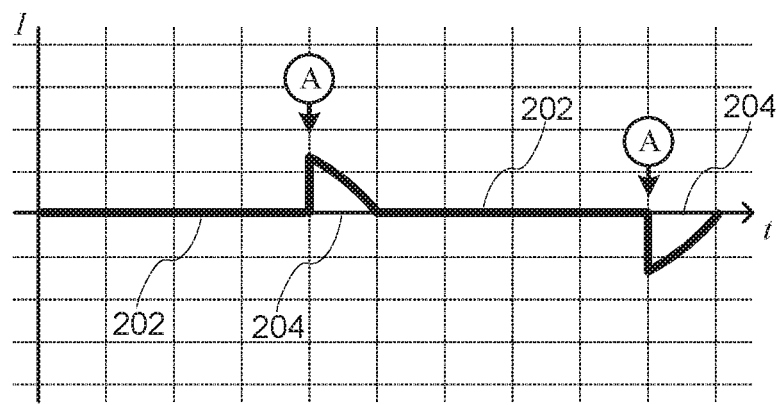
Figure 4C:
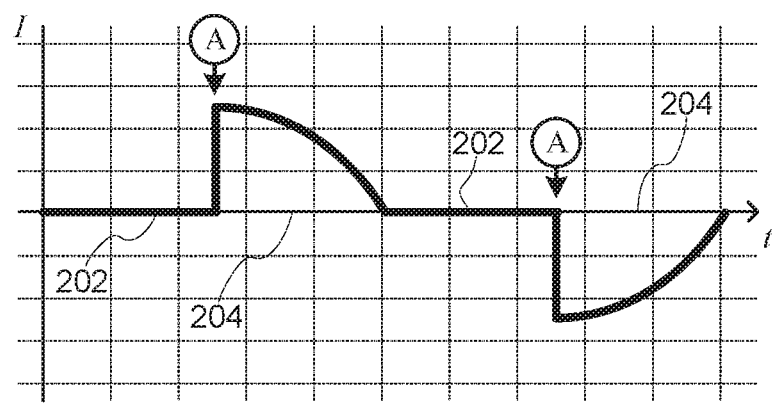
Figure 4D:
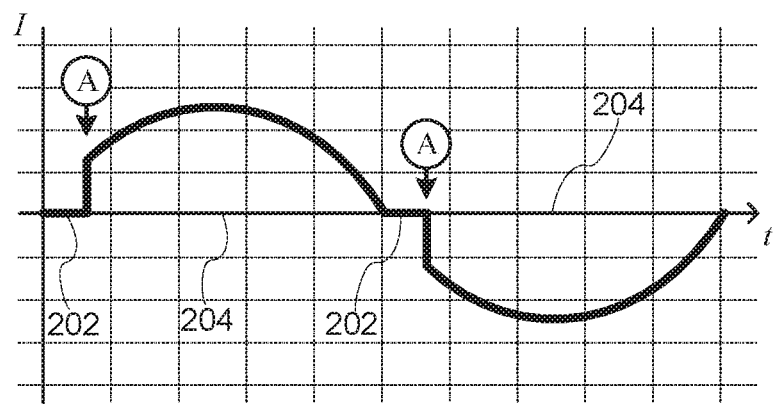

As shown in FIGS. 2B-2D, the controllably conductive device operates in the non-conductive state for less than the entire half-cycle. That is, the controllably conductive device operates in the non-conductive state from the zero-crossing at the beginning of the half-cycle only to a certain point, A, within the half-cycle. The gate of the controllably conductive device is triggered at time A, after which the controllably conductive device operates in the conductive state until it commutates to off at the next zero crossing (i.e., at the end of the half-cycle).

As shown in FIG. 2B, at a relatively low load control setting (e.g., a low-end dimming level), the first portion 202 of the half-cycle may have a duration that is greater than 50% of the half-cycle. As shown in FIG. 2C, at a mid-level load control setting, the first portion 202 of the half-cycle may have a duration of about 50% of the half-cycle. As shown in FIG. 2D, at a relatively high load control setting (e.g., a high-end dimming level), the first portion 202 of the half-cycle may have a duration that is less than 50% of the half-cycle.

FIGS. 3A-3D depict example phase-control waveforms representing voltage across the corresponding load (i.e., the dimmed-hot voltage) in a forward-phase-control dimming system. As shown, the voltage waveforms depicted in FIGS. 3A-3D are complementary to the waveforms depicted in FIGS. 2A-2D. That is, when the controllably conductive device is in the non-conductive state, there is a voltage drop across the two-wire load control device and no voltage drop across the load. Conversely, when the controllably conductive device is in the conductive state, there is a voltage drop across the load and no voltage drop across the two-wire load control device.

FIGS. 4A-4D depict example phase-control waveforms representing load current supplied to the load in a forward-phase-control dimming system when the load is a resistive load, for example, an incandescent lamp. As shown, the load current waveforms depicted in FIGS. 4A-4D correspond to the waveforms depicted in FIGS. 3A-3D. That is, when the controllably conductive device is in the non-conductive state, the amount of load current is supplied to the load is effectively zero. Conversely, when the controllably conductive device is in the conductive state, operating current is supplied to the load. Alternatively, the load current supplied to a capacitive or inductive load may be out of phase with the dimmed-hot voltage applied to the load. In addition, some electrical loads, such as screw-in compact fluorescent lamps and screw-in light-emitting diode light sources, may conduct load current that is not sinusoidal.

Figure 5:
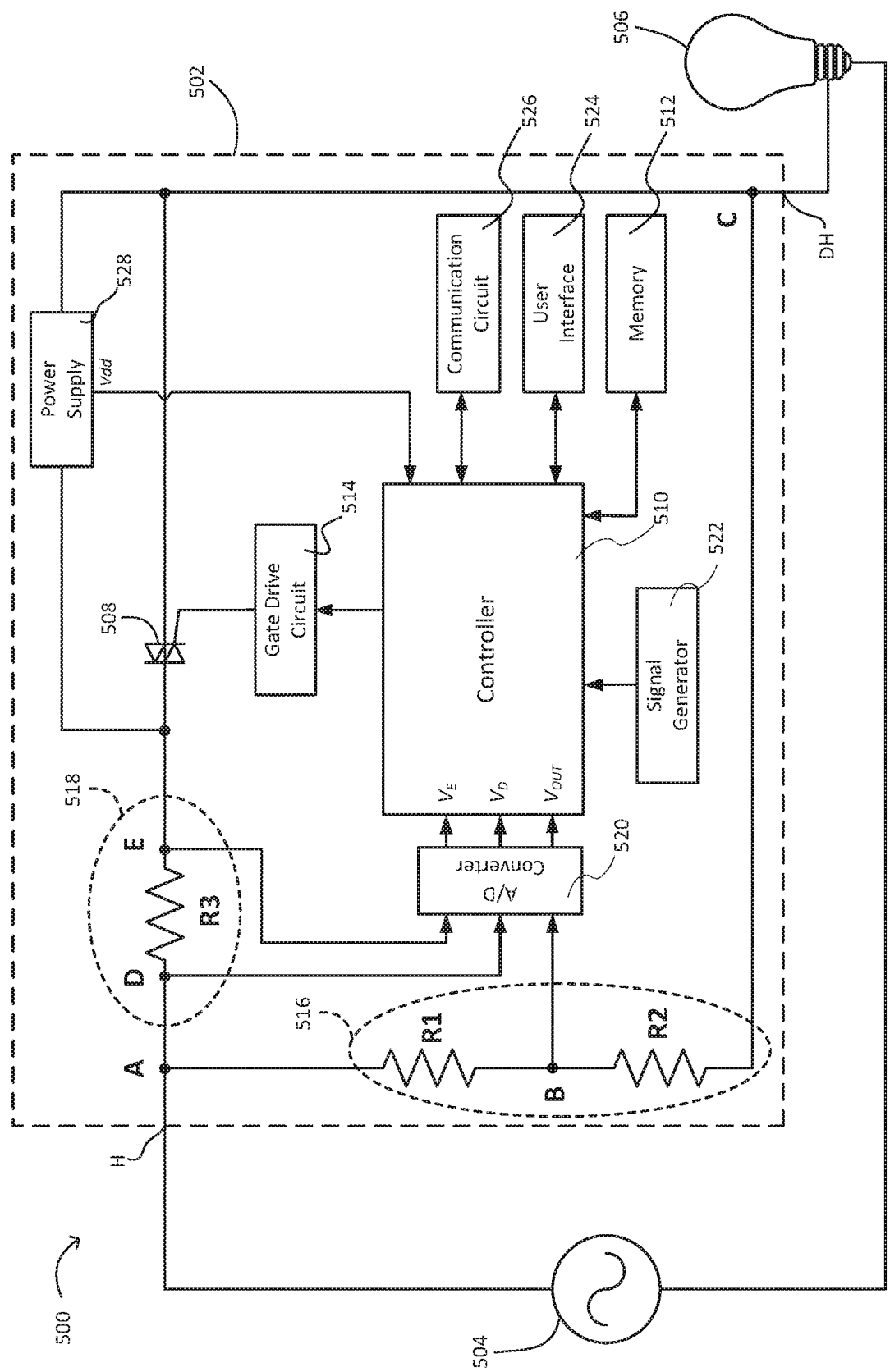
FIG. 5 is a block diagram of an example a load control system that includes a two-wire load control device configured to estimate real-time power consumption by a load controlled by the two-wire load control device.

FIG. 5 depicts an example load control system 500 that includes a "two-wire" load control device 502. The two-wire load control device 502 may be electrically connected between a source of electrical energy, for instance an alternating current (AC) power source 504, and an electrical load 506, such as the illustrated lighting load, for example. The two-wire load control device 502 may be electrically connected in series between the AC power source 504 and the load 506. The load control device 502 has a hot terminal H coupled to the AC power source 504 and a dimmed-hot terminal DH coupled to the electrical load 506. The two-wire load control device 502 may be operable to control an amount of power delivered from the AC power source 504 to the load 506. For example, the two-wire load control device 502 may be an electronic switch or dimmer.

As defined herein, a "two-wire" load control device does not require a require a direct connection to the neutral side N of the AC power source 504. In other words, all currents conducted by the two-wire load control device must also be conducted through the load 506. A two-wire load control device may have only two terminals (i.e., the hot terminal H and the dimmed hot terminal DH as shown in FIG. 5). Alternatively, a two-wire load control device (as defined herein) could comprise a three-way load control device that may be used in, for example, a three-way lighting system and has at least three load terminals, but does not require a neutral connection. In addition, a two-wire load control device may comprise an additional connection that provides for communication with a remote control device (for remotely controlling the load control device), but does not require the load control device to be directly connected to neutral.

The two-wire load control device 502 may include a controllably conductive device 508 adapted to be electrically coupled between the AC power source 504 and the load 506. For example, the controllably conductive device 508 may be operable between a non-conductive state in which the AC input voltage from the AC power source 504 is not delivered to the load 506 and a conductive state in which the AC input voltage from the AC power source 504 passes through the controllably conductive device 508 and is delivered to the load 506. The controllably conductive device 508 may be referred to as "off" when in the non-conductive state and "on" when in the conductive state.

The controllably conductive device 508 may be a bidirectional semiconductor switch, for example, a thyristor, such as a triac. However it should be appreciated that the controllably conductive device 508 of the two-wire load control device 502 is not limited to a triac and that the two-wire load control device 502 may include any suitable controllably conductive device, such as, for example, a relay, one or more field-effect transistors (FETs), a FET in a rectifier bridge, two FETs in anti-series connection, one or more silicon-controlled rectifiers (SCRs), or one or more insulated-gate bipolar junction transistors (IGBTs).

The two-wire load control device 502 may include a control circuit (e.g., a controller 510) that may be configured to control various functional aspects of the two-wire load control device 502, such as operation of the controllably conductive device 508. The controller 510 may include one or more components, such as processors (e.g., microprocessors), microcontrollers, integrated circuits (e.g., field programmable gate arrays or application-specific integrated circuits), or the like, in any combination. For example, the controller 510 may include a processor (not shown) that may execute computer-executable instructions in order to control one or more functional aspects of the two-wire load control device 502.

The two-wire load control device 502 may include a memory 512. The memory 512 may be communicatively coupled to the controller 510 and may operate to store information such as computer-executable instructions, configuration settings associated with operation of the two-wire load control device 502, or the like. The memory 512 may include any component suitable for storing the information. For example, the memory 512 may include one or more components of volatile and/or non-volatile memory, in any combination. The memory 512 may be internal and/or external with respect to the controller 510. For example, the memory 512 and the controller 510 may be integrated within a microchip. During operation of the two-wire load control device 502, the controller 510 may store and/or retrieve information, for instance the computer-executable instructions, from the memory 512. It should be appreciated that functionality of the controller 510 may include any combination of hardware, firmware, and/or software.

The controller 510 may be configured to control operation of the controllably conductive device 508. For example, the controller 510 may cause the controllably conductive device 508 to operate between the conductive and non-conductive states, respectively.

The two-wire load control device 502 may include a drive circuit 514 that is electrically connected between the controller 510 and the controllably conductive device 508 and is communicatively coupled to the controller 510. The drive circuit 514 may include circuitry configured to convert control signals issued by the controller 510 into triggering signals that may trigger the controllably conductive device 508 to operate between the non-conductive state and the conductive state.

The controller 510 may issue control signals to the drive circuit 514 in accordance with a prescribed interval. For example, the controller 510 may detect, or otherwise be made aware of (e.g., via a zero-cross detection circuit (not shown)), a zero crossing event associated with an AC waveform generated by the AC power source 504. The controller 510 may be configured to issue a control signal to the drive circuit 514 to operate the controllably conductive device 508 from the non-conductive state to the conductive state (i.e., to render the controllably conductive device conductive) at a firing time during a half-cycle (e.g., at point A as shown in FIGS. 2A-4D). The controller 510 may time the firing of the controllably conductive device 508 from the previous zero-crossing as determined from the zero-cross detection circuit. When the controllably conductive device 508 is implemented as a triac, the triac will become non-conductive when the load current through the triac drops below a rated holding current of the triac at the end of the half-cycle. Accordingly, the controllably conductive device 508 is rendered conductive for a duration of the interval from the firing time through the end of the half-cycle. If the controllably conductive device 508 is implemented as two FETs in anti-series connected, the controller may be configured to operate the controllably conductive device 508 from the non-conductive state to the conductive state at the firing time for a duration of the prescribed interval and, upon expiration of the interval, to operate the controllably conductive device 508 from the conductive state to the non-conductive state. The expiration of the interval may substantially coincide with a subsequent, consecutive zero crossing event associated with the AC input voltage waveform.

The duration of the interval during which the controllably conductive device 508 is operating in the non-conductive state may correspond to a first portion 202 of a half-cycle of a waveform (e.g., as depicted in FIGS. 2B-2D, 3B-3D, and 4B-4D). Upon expiration of the interval, for example at point "A," the controller 510 may operate the controllably conductive device 508 from the non-conductive state to the conductive state for a second portion 204 of the half-cycle that may correspond to substantially an entirety of a remainder of the half-cycle. The controller 510 may determine the duration of the interval, for example, in accordance a desired dimming level of the load 506 that may be communicated to the controller 510. It should be appreciated that the two-wire load control device 502 need not include the drive circuit 514. For example, the functionality of the drive circuit 514 may be integrated into the controller 510 such that the controller may directly cause the controllably conductive device 508 to operate between the respective non-conductive and conductive states in accordance with the prescribed interval.

The controller 510 may be configured to perform one or more measurement and/or computational operations in order to compute an estimate of real-time power consumption of the load 506 when the controllably conductive device 508 operates in the conductive state. The controller 510 may be configured to obtain voltage data pertaining to a voltage drop across the two-wire load control device 502 during a first portion (e.g., the first portion 202) of at least one half-cycle of an AC waveform generated by the source 504. The controller 510 may be further configured to measure a current through the two-wire load control device 502 during a second portion (e.g., the second portion 204) of the at least one half-cycle of the AC waveform. The current through the two-wire load control device 502 may be representative of a load current delivered to the load 506 during the second portion of the at least one half-cycle of the AC waveform. The controller 510 may be further configured to extrapolate an estimate of a voltage drop across the load 506 during the second portion of the at least one half-cycle of the AC waveform when the voltage drop across the two-wire load control device is substantially zero. The controller 510 may extrapolate the estimate of the voltage drop across the load 506 based upon the voltage data obtained by the controller 510 during the first portion of the at least one half-cycle of the AC waveform.

Figure 6A:
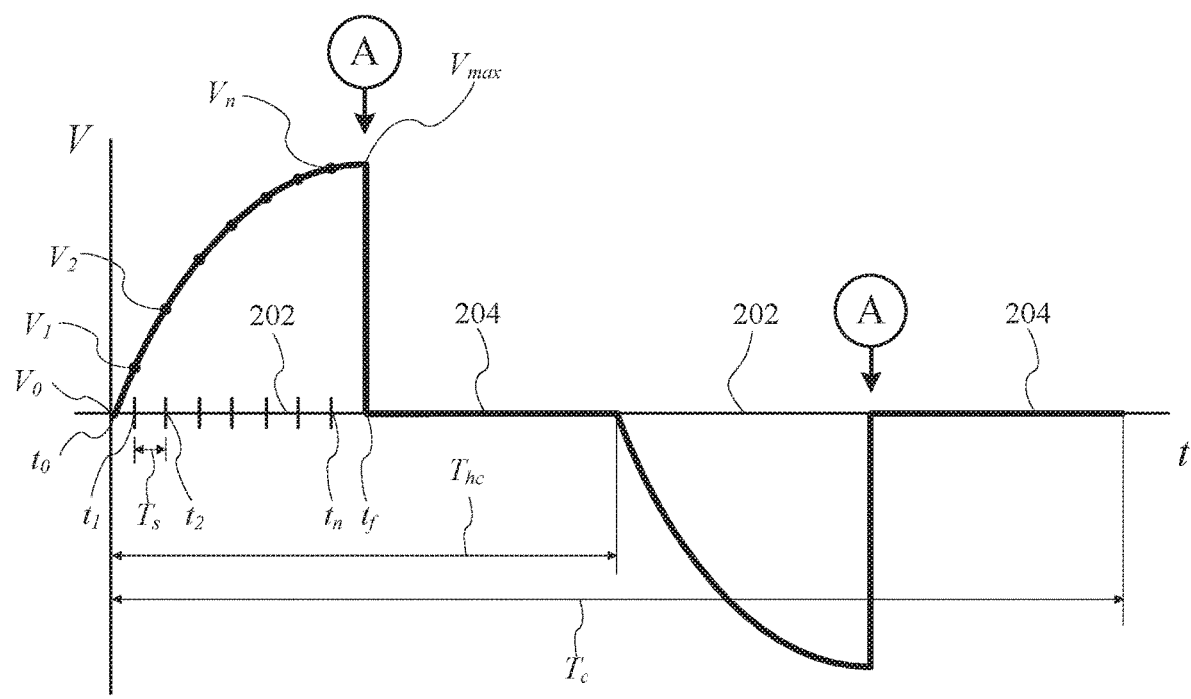
FIG. 6A depicts an example of sampling voltage values of an observed portion of a voltage waveform during a first portion of a half-cycle of the waveform.

Referring additionally to FIG. 6A, the controller 510 may be configured to sample voltage data pertaining to the voltage drop across the two-wire load control device 502 during the first portion of the at least one half-cycle of the AC waveform, for instance during the prescribed interval.

The controller 510 may operate to determine an operating, or fundamental, frequency of the AC waveform generated by the source 504, for example, by measuring the lengths of one or more half-cycles. For example, the controller 510 may be operable to measure the time from one zero-crossing to the next zero-crossing and to average the measured half-cycles lengths over time. The fundamental frequency may correspond with a period $T_c$ representative of a full cycle of the AC waveform and with a period $T_{hc}$ representative of a half-cycle of the AC waveform. The controller 510 may determine a sampling interval $T_s$ such that a suitable number of voltage values corresponding to the voltage drop across the two-wire load control device 502 are collected during the first portion of the at least one half-cycle of the AC waveform. The sampling interval $T_s$ may be determined in accordance with the fundamental frequency (e.g., the period TO. The controller 510 may store voltage data corresponding to the respective sampled voltage values (e.g., in the memory 512).

The controller 510 may be configured to sample voltage values of the AC waveform generated by the source 504 in accordance with the sampling interval $T_s$. For example, the controller 510 may sample voltage values of the AC waveform (e.g., $V_1, V_2, \ldots V_n$) that correspond to n number of sampling times (e.g., $t_1, t_2, \ldots t_n$) after a zero crossing (represented by $t_0$ and $V_0$). The controller 510 may sample the voltage waveform with a voltage measuring circuit. For example, the two-wire load control device 502 may include a voltage measuring circuit, such as a voltage divider 516. The voltage divider 516 may be used to measure a voltage drop across the two-wire load control device 502, for instance when the controllably conductive device 508 operates in the non-conductive state such that AC from the source 504 is not delivered to the load 506.

The voltage divider 516 includes resistors R1 and R2 that are electrically connected to each other at point B and in series between points A and C. The voltage at points A and C may be representative of the voltage drop across the two-wire load control device 502. The respective resistances of R1 and R2 may be larger than any resistance that may be observed at the load 506, such that the resistance of the load 506 is essentially zero ohms relative to the resistances of resistors R1 and R2, respectively. The controller 510 may receive a control signal $V_{OUT}$ from the voltage divider 516 that is representative of the voltage drop across the two-wire load control device 502.

The controller 510 may be configured to stop sampling the voltage waveform approximately when the controllably conductive device 508 is switched from the non-conductive state to the conductive state, for example substantially coincident with the generation of a corresponding triggering signal by the controller 510. During the second portion of the at least one half-cycle of the AC waveform, the controller 510 may be configured to extrapolate estimated values of voltage representative of a voltage drop across the load 506 during the second portion of the at least one half-cycle. The controller 510 may begin extrapolating voltage values representative of the voltage drop across the load 506 substantially coincident with the switching of the controllably conductive device 508 from the non-conductive state to the conductive state.

The controller 510 may be configured to determine a firing phase angle of the controllably conductive device 508 when the controllably conductive device 508 is switched from the non-conductive state to the conductive state. For instance, the controller may derive the firing phase angle based upon a firing time $t_f$ at which the controllably conductive device 508 was switched, or fired, and the period $T_{hc}$ corresponding to the length of the at least one half-cycle. The controller 510 may be configured to determine an estimate $V_{max}$ of a corresponding maximum, or peak, voltage of the AC waveform. The values of $t_f$ and/or $V_{max}$ may be stored in the memory 512.

Figure 6B:
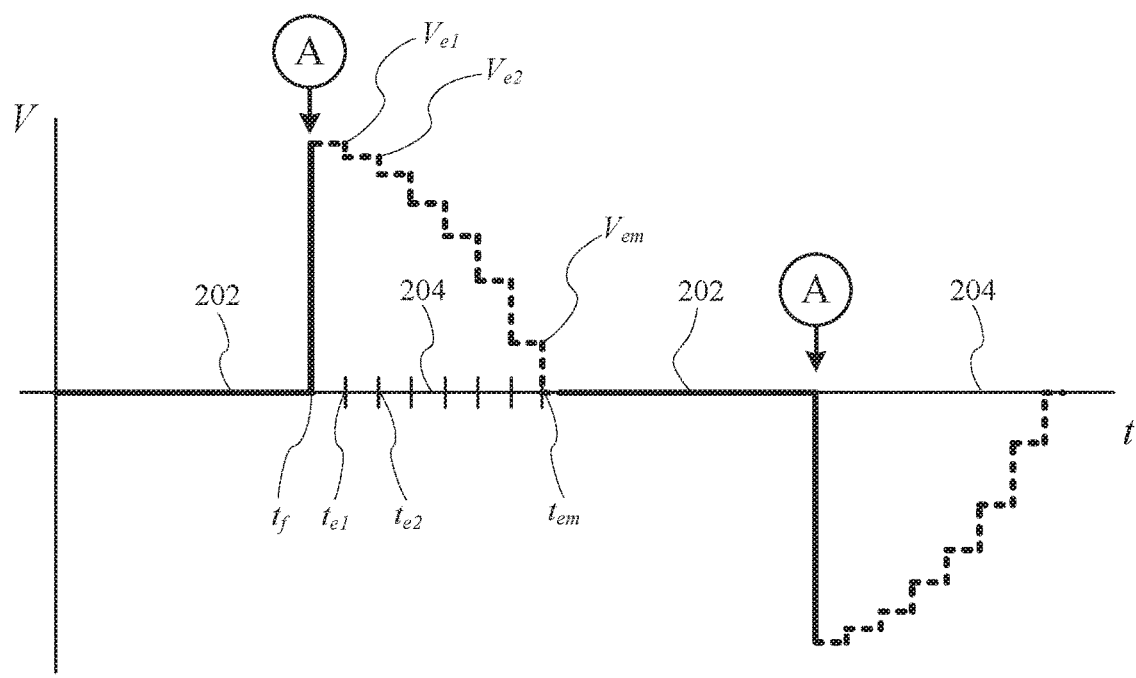
FIG. 6B depicts an example complementary waveform that is representative of extrapolated voltage values during a second portion of the half-cycle of the waveform illustrated in FIG. 6A.

Referring additionally to FIG. 6B, the controller 510 may be configured to extrapolate one or more values of estimated voltage corresponding to a voltage drop across the load 506 during the second portion of the at least one half-cycle of the AC waveform, during which the voltage drop across the two-wire load control device 502 is substantially zero volts. The extrapolated voltage values may correspond to, and may be representative of, the magnitude of the voltage generated across the load control device during the second portion of the half-cycle. The controller 510 may extrapolate the estimated voltage values based upon the voltage values sampled during the first portion of the at least one half-cycle of the AC waveform and/or the peak voltage $V_{max}$, for example.

The extrapolated voltage values (e.g., $V_{e1}, V_{e2} \ldots V_{em}$) may correspond to m number of sampling times (e.g., $t_{e1}, t_{e2} \ldots t_{em}$) after the switching of the controllably conductive device 508 from the non-conductive state to the conductive state. The duration of the extrapolated voltage intervals may be equal to, shorter than, or longer than the sampling interval $T_s$. Similarly, the number m of extrapolated voltage values may be equal to, less than, or greater than the number n of sampled voltage values. The extrapolated voltage values may be used to construct a waveform that may be complementary to the portion of the AC waveform observed by the controller 510 during the first portion of the at least one half-cycle, for example as illustrated in FIG. 6B. The controller 510 may store voltage data corresponding to the respective extrapolated voltage values (e.g., in the memory 512).

The two-wire load control device 502 may include a signal generator 522. The signal generator 522 may generate one or more complementary voltage waveforms, or fill signals, based for example, on the extrapolated voltage values of the voltage drop across the load 506 during the second portion of the at least one half-cycle of the AC waveform. For example, the controller 510 may retrieve the voltage data sampled during the first portion of the half-cycle of the AC waveform from the memory 512 and may provide the voltage data to the signal generator 522. The signal generator 522 may generate one or more complementary voltage waveforms based upon the voltage data that may be representative of approximations of respective voltages across the load 506, for instance when the controllably conductive device 508 is in the conductive state and the voltage drop across the two-wire load control device 502 is substantially zero volts. The signal generator 522 may generate the one or more complementary voltage waveforms in accordance with one or more waveform creation schemes, as illustrated in FIGS. 7A-7E.

The controller 510 may be configured to calculate one or more values corresponding to a real-time amount of power consumed by the load 506 during the second portion of the at least one half-cycle of the AC waveform. For example, the one or more values of power consumed by the load may be calculated based on the extrapolated voltage values and corresponding measurements of current through the two-wire load control device 502. The controller 510 may be configured to measure current through the two-wire load control device at one or more points in time during the second portion of the at least one half-cycle of the AC waveform, which may be representative of a current delivered to the load 506 during the second portion of the at least one half-cycle of the AC waveform. For example, the two-wire load control device 502 may include a current measuring circuit.

The two-wire load control device 502 may include a current measuring circuit 518 that includes a resistor R3 (e.g., a micro-Ohm resistor) that may be used to measure a current through the two-wire load control device 502, for instance when the controllably conductive device 508 is in the conductive state. The controller 510 may be configured to measure a voltage drop across the resistor R3. For instance, the controller 510 may receive inputs $V_D$ and $V_E$ that are representative of respective values of line voltage at points D and E. The resistance of the resistor R3 may be known to the controller 510, for instance stored in the memory 512. The controller 510 may use the respective values of $V_D$ and $V_E$ and the resistance of R3 to calculate the load current through the two-wire load control device 502.

The controller 510 may sample the current through the two-wire load control device 502 substantially coincident with the sampling intervals corresponding to the extrapolated voltage values (e.g., at $t_{e1}, t_{e2} \ldots t_{em}$). The controller 510 may store current data corresponding to the respective extrapolated voltage values (e.g., in the memory 512).

The controller 510 may calculate an amount of power consumed by the load 506 during the second portion of the at least one half-cycle of the AC waveform. For example, the controller 510 may calculate one or more values corresponding to an amount of power consumed by the load 506 based on the product of one or more of the extrapolated voltage values and corresponding ones of the measured current values. The controller 510 may calculate a plurality of values of power consumed by the load 506 during the second portion of the at least one half-cycle of the AC waveform may be calculated (e.g., in real time) and may store the plurality of values (e.g., in the memory 512).

The controller 510 may use power values and/or the underlying voltage/current values (e.g., corresponding sampled voltage and sampled current values, for example, and/or corresponding extrapolated voltage values and sampled current values, for example) to determine average power. For example, the average power may be obtained by multiplying instantaneous values of the voltage and current, summing the values over a time period, and then dividing by the corresponding number of samples in the time period. For example, the average power may be obtained by summing power values over a time period and then dividing by the corresponding number of values in the time period. The time period may be selected to average over some or all of the conductive portion of the half-cycle, over some or all of the non-conductive portion of the half-cycle, and/or a combination of some or all of conductive portion and non-conductive portion of the half-cycle. The time period may be selected to average over some or all of one or more half-cycles. The controller 510, as described above, may store these values (e.g., average power values, instantaneous power values, and/or the underlying voltage/current values) in any combination, in memory (e.g., in memory 512). The average power consumption of the load 506 may be stored and/or may be reported by the controller 510, for instance in accordance with one or more power reporting schemes, as described in more detail below.

The two-wire load control device 502 may include an analog to digital (A/D) converter 520 that may be electrically connected between the controller 510 and points B, D, and E, respectively. The A/D Converter 520 may receive respective analog waveform information associated with the inputs $V_D$, $V_E$, and $V_{OUT}$, may convert the analog waveform information into respective digital waveform information, and may communicate the digital waveform information to the controller 510. The controller 510, A/D converter 520, and signal generator 522 could all be implemented on a single integrated circuit.

The load control device 502 may also include a power measurement chip (not shown). The power measurement chip, which may be a MAXIM integrated circuit, for example part number 78M6613, that may be external to the controller. A signal representing the voltage across the load may be provided to the power measurement chip. The power measurement chip may compute the power being consumed by the load, and communicate such power computations serially with the controller.

FIGS. 7A-7E depict example voltage waveforms. The illustrated voltage waveforms are representative of AC voltage over time for two half-cycles that are substantially consecutive in time. Both half-cycles of each voltage waveform include respective first and second portions. The first portion 700 of each half-cycle, illustrated in solid line, represents a portion of the voltage waveform that may be observed by the two-wire load control device 502, for instance when the controllably conductive device 508 is in the non-conductive state such that an AC line voltage supplied by the source 504 is dropped across the two-wire load control device 502.

Figure 7A:
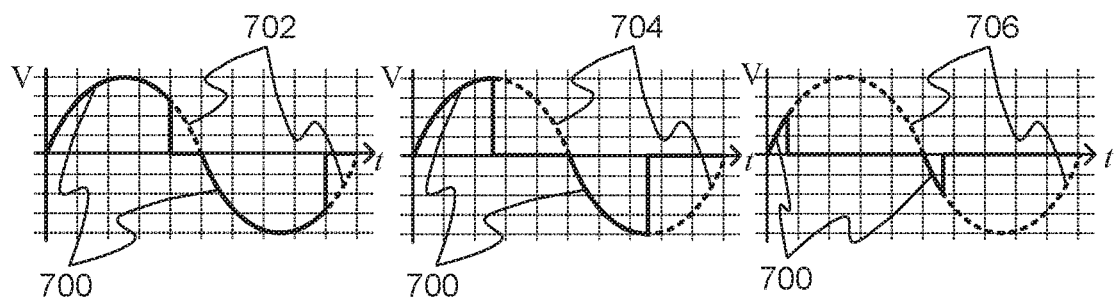
FIGS. 7A-7E depict various voltage waveforms.

With reference to FIG. 7A, the second portions 702, 704, and 706 of each half-cycle, illustrated in dashed line, represent portions of the voltage waveform that correspond to respective voltage drops across the load 506, for instance when the controllably conductive device 508 is in the conductive state. The two-wire load control device 502 is incapable of measuring the voltage drops across the load 506, and is thus incapable of observing the voltage waveform (e.g., second portions 702, 704, and 706) during the second portion of each half-cycle when the controllably conductive device 508 is in the conductive state. However a representation of the voltage waveform during the second portion of each half-cycle may be extrapolated, for example by the signal generator 522, from the observed first portion 700, such that each second portion is substantially complementary with a corresponding first portion 700. Second portions 702, 704, and 706, represent a relatively low load control setting, a mid-level load control setting, and a relatively high load control setting, respectively.

With reference to FIGS. 7B-7E, the second portion of each half-cycle represents a portion of the voltage waveform, or fill signal, that may be extrapolated such that each second portion is substantially complementary with a corresponding first portion 700. The extrapolated second portion of each half-cycle may be representative of a voltage drop across the load 506 during the second portion of the half-cycle, for instance when the controllably conductive device 508 is in the conductive state and the voltage drop across the two-wire load control device 502 is substantially zero. Thus, each fill signal may be representative of the magnitude of the voltage generated across the load control device during the second portion of the half-cycle.

Figure 7B:
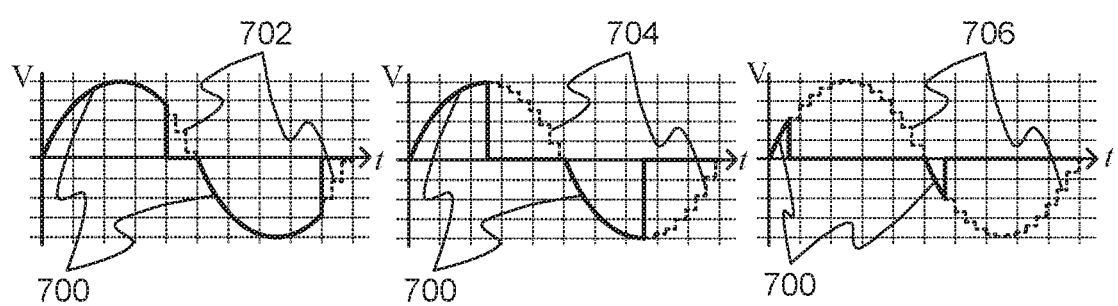

FIG. 7B depicts second portions 702, 704, and 706 that comprise step-sine waveforms that may complement corresponding first portions 700 of the voltage waveforms. Each step-sine waveform may represent a composite of multiple square waves of varying duration, or width, and amplitude, such that the composite step-sine waveform may approximate the voltage waveform corresponding to the voltage drop across the load 506 during the second portion of each half-cycle. The step-sine-wave may include steps based on at least one pulse-width modulated signal, such as a pulse-width modulated signal generated by the controller 510. The step-sine-wave may include steps based on one or more phase correction corresponding to a zero-crossing detected by the controller 510. The number of steps and the duration and/or amplitude of each step of a step-sine waveform may be determined in accordance with operation of the controllably conductive device 508.

Figure 7C:
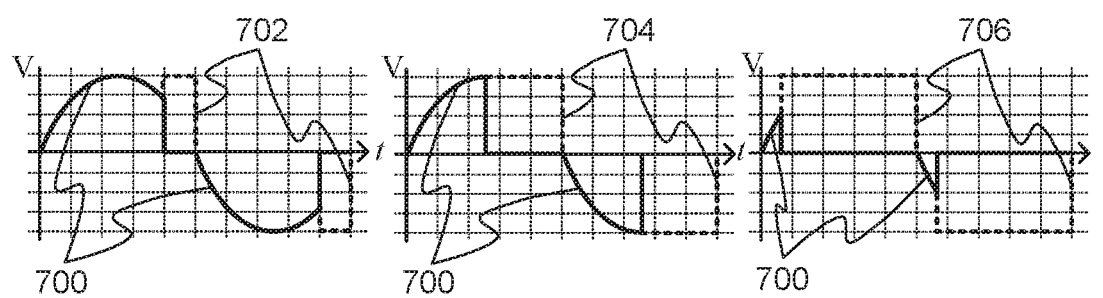

FIG. 7C depicts second portions 702, 704, and 706 that comprise square wave waveforms having constant amplitude that may complement corresponding first portions 700 of the voltage waveforms. The respective durations, and thus the widths, of the square waves may be set such that the square wave waveforms may approximate the voltage waveform corresponding to the voltage drop across the load 506 during the second portion of each half-cycle. The duration of each square wave may be determined in accordance with operation of the controllably conductive device 508. For example, the square wave may have a relatively short duration in accordance with a relatively low load control setting, and may have increasingly longer durations in accordance a mid-level load control setting and a relatively high load control setting, respectively.

Figure 7D:
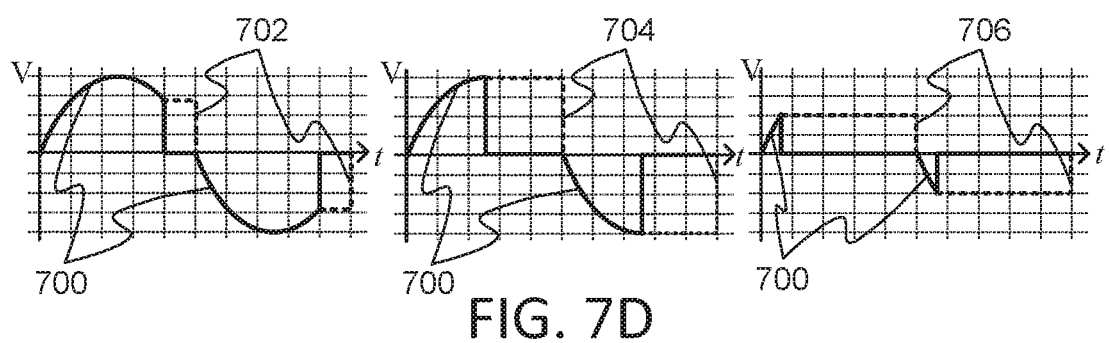

FIG. 7D depicts second portions 702, 704, and 706 that comprise square wave waveforms having different durations and/or amplitudes that may complement corresponding first portions 700 of the voltage waveforms. The respective durations and/or amplitudes of the square waves may be set such that the square wave waveforms may approximate the voltage waveform corresponding to the voltage drop across the load 506 during the second portion of each half-cycle. The duration and/or amplitude of each square wave may be determined in accordance with operation of the controllably conductive device 508. For example, the respective amplitudes of the square waves may be set so as to substantially match the amplitudes of the first portions 700 when the controllably conductive device 508 is operated from the non-conductive state to the conductive state.

Figure 7E:
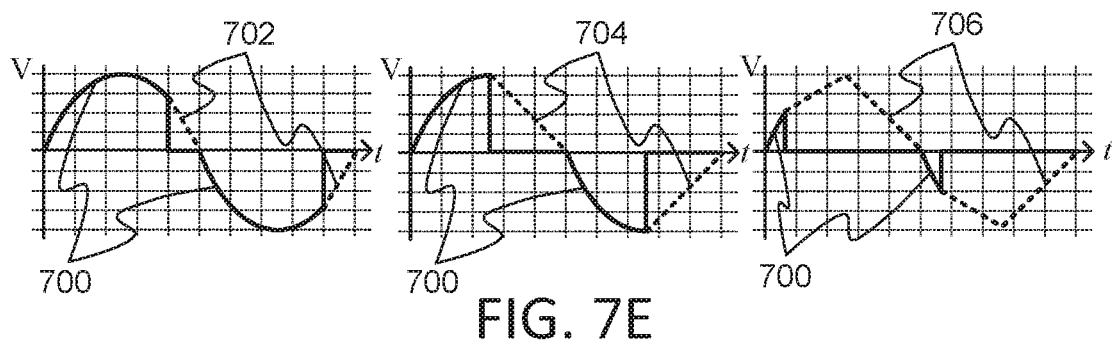

FIG. 7E depicts second portions 702, 704, and 706 that comprise triangle wave waveforms that may complement corresponding first portions 700 of the voltage waveforms. Each triangle wave may include one or more segments having the same or different angles with respect to each other, such that the triangle wave may approximate the voltage waveform corresponding to the voltage drop across the load 506 during the second portion of each half-cycle. The number of segments and a corresponding angle of each segment of a triangle wave may be determined in accordance with operation of the controllably conductive device 508. For example, the triangle wave may have a single segment in accordance with a relatively low load control setting and a mid-level load control setting, respectively, and may have two segments having differing angles with respect to each other in accordance with a relatively high load control setting.

Any of the above-described complementary voltage waveforms may be extrapolated based on the respective first portions 700 of a corresponding voltage waveform. The complementary voltage waveforms may be extrapolated and/or generated by the signal generator 522. It should be appreciated that a complementary voltage waveform generated by the signal generator 522 may comprise any combination of the above-described complementary voltage waveforms. For example, a complementary voltage waveform may have a first section generated in accordance with a first one of the complementary waveforms, may have a second section generated in accordance with a second one of the complementary waveforms that is different than the first one of the complementary waveforms, and so on. It should further be appreciated that the signal generator 522 is not limited to the above-described complementary voltage waveforms and that the signal generator 522 may be configured to generate any suitable complementary voltage waveform, as desired. For example, the signal generation techniques described in commonly-assigned U.S. patent application Ser. No. 13/793,245, entitled TWO-WIRE DIMMER SWITCH WITH FILTER, filed Mar. 11, 2013, which is hereby incorporated by reference, may be used.

Referring again to FIG. 5, the two-wire load control device 502 may include a user interface 524 that is communicatively coupled to the controller 510. The user interface 524 may include any component suitable for presenting information to and/or receiving information from a user of the two-wire load control device 502. For example, the user interface 524 may include one or more manually operated input devices (not shown) such as buttons, switches, sliders, or the like. The user interface 524 may include a display (not shown) comprising one or more Light Emitting Diode (LED) indicators, a Liquid Crystal Display (LCD), a touch screen display, or the like, in any combination. The controller 510 may receive commands, configuration information, or the like, indicated by a user via the user interface 524. The controller 510 may provide information for presentation via the user interface, information 524, such as a present dimming level of the two-wire load control device 502, respective confirmations of one or more commands received from the user and executed by the controller 510, or the like. For example, the controller 510 may receive input entered by a user via the user interface 524, such as an indication of a desired dimming level, and may confirm receipt and/or or execution of the desired dimming level via the user interface 524, for instance by rendering an indication on the display.

The two-wire load control device 502 may include a communication circuit 526 that is communicatively coupled to the controller 510. The communication circuit 526 may include one or more components operable for the transmission and/or reception of information comprising signals and/or data. For instance, the communication circuit 526 may include a transceiver, a modem, and/or the like. The controller 510 may be configured to receive commands and/or configuration information pertaining to operation of the two-wire load control device 502 via the communication circuit 526. For example, the controller 510 may receive information, such as operational commands, via the communication circuit 526 from one or more external devices such as a central controller or transmitter, an energy management system (EMS), a communication device associated with a user of the two-wire load control device 502 (e.g., a smart phone, computer, etc.), or the like. The controller 510 may be configured to transmit information via the communication circuit 526. For example, the controller 510 may be configured to generate one or more reports pertaining to operation of the load control system 500 and to communicate the one or more reports to a device external to the two-wire load control device 502, such as an EMS.

The communication circuit 526 may be configured with respective capabilities to transmit and/or receive information in accordance with one or more communication schemes, as desired. For example, the communication circuit 526 may be configured to be capable of transmitting and receiving information via radio frequency (RF) communication, infrared (IR) communication, low voltage communication such as low-voltage differential signaling (LVDS), and/or power line communication (PLC) schemes.

The two-wire load control device 502 may include a power supply 528 that is configured to supply power to one or more components of the two-wire load control device 502, for instance when the controllably conductive device 508 is in the conductive state. The power supply 528 may be configured to accumulate and store electricity when a voltage associated with the source 504 is dropped across the two-wire load control device 502, for instance when the controllably conductive device 508 is in the non-conductive state. The stored electricity may be used to supply power to one or more components of the two-wire load control device 502.

It should be appreciated that one or more of the above-described components of the two-wire load control device, such as the memory 512, the drive circuit 514, the voltage measuring circuit (e.g., the voltage divider 516), current measuring circuit 518, the A/D converter 520, the signal generator 522, the user interface 524, and/or the communication circuit 526, may be at least partially integrated (e.g., completely integrated) with the controller 510, for example within a single microchip, such as an integrated circuit, or implemented in software.

Rather than controlling the firing angle (i.e., the firing time $t_f$) of the phase-control waveform (as shown in FIGS. 3A-3D) using the forward phase-control technique to thus control the amount of power delivered to the load, the load control device 502 could alternatively be operable to encode digital information in the firing angle of the phase-control waveform to transmit digital messages to another load control device for controlling the load. An example of such a communication system is described in greater detail in commonly-assigned U.S. patent application Ser. No. 13/359,722, filed Jan. 27, 2012, entitled "Digital Load Control System Providing Power and Communication Via Existing Power Wiring", the entire disclosure of which is hereby incorporated by reference.

Figure 8:
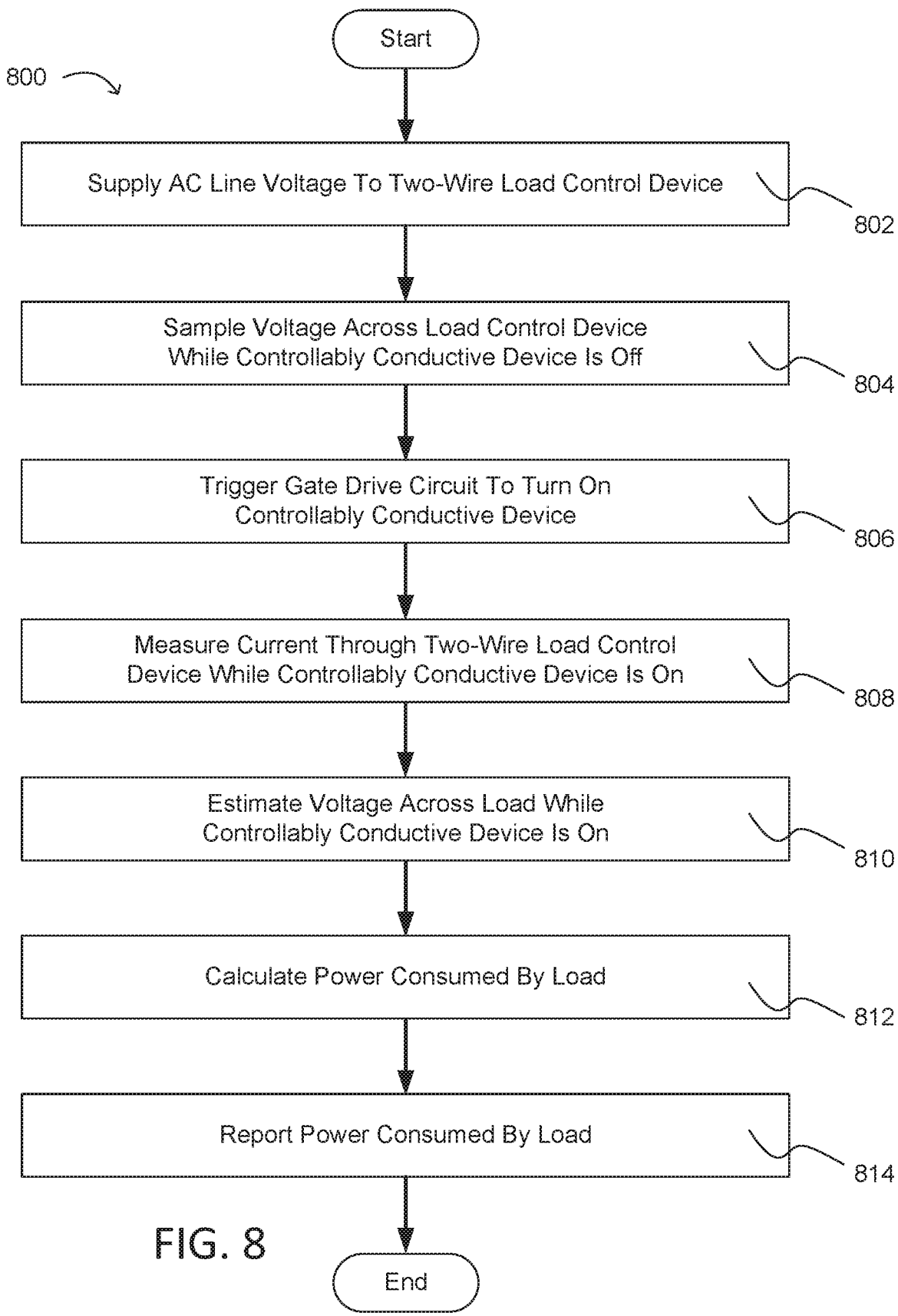
FIG. 8 is a flow diagram of an example method for power measurement and reporting by a two-wire load control device.

FIG. 8 depicts a flow diagram of an example method 800 for measuring and reporting of a power consumption of the load 506 while the load 506 is on (i.e., is actively powered or driven by the source 504). At 802, with the load 506 on, an AC line voltage may be supplied to the two-wire load control device 502 by the source 504.

At 804, a voltage drop across the two-wire load control device 502 may be measured while the controllably conductive device 508 is in the non-conductive state, for example throughout a duration of a first portion of a half-cycle. The voltage drop across the two-wire load control device 502 may be measured, or sampled, at one or more select times during the first portion of the half-cycle while the controllably conductive device 508 is off. For example, the controller 510 may measure voltage drop across the two-wire load control device 502 by using a voltage measuring circuit, such as the voltage divider. The measured values of voltage and corresponding select one or more select times may be stored in the memory 512. The controller 510 may aggregate the sampled values of voltage into the first portion 700 of the half-cycle.

At 806, the drive circuit 514 may be triggered to operate the controllably conductive device 508 from the non-conductive state to the conductive state, for instance at the desired firing time $t_f$. The controllably conductive device 508 may be operated in the conductive state for a second portion of the half-cycle that substantially corresponds to a remainder of the half-cycle. During the second portion of the half-cycle, for example substantially throughout a duration of the second portion of the half-cycle, a voltage approximately equal to the AC line voltage may be dropped across the load 506, such that the voltage drop across the two-wire load control device 502 is essentially zero volts. Additionally, during the second portion of the half-cycle a current through the two-wire load control device 502 may be representative of the AC being drawn by the load 506, that is the AC being supplied to the load 506 by the source 504 during the second portion of the half-cycle when the controllably conductive device 508 is on.

At 808, the load current conducted through the two-wire load control device 502 during the second portion of the half-cycle, while the controllably conductive device is on, may be measured. For example, the controller 510 may measure the current through the two-wire load control device 502 by using the current measuring circuit. The measured value of current may be stored in the memory 512.

At 810, a voltage drop across the load 506 during the second portion of the half-cycle may be estimated. For example, the signal generator 522 may extrapolate a voltage waveform that may be representative of the voltage waveform across the load 506 during the second portion of each half-cycle. The voltage waveform during the second portion of the half-cycle may be extrapolated from and/or based upon values of the voltage drop across the two-wire load control device 502 measured during the first portion of the half-cycle, such that the extrapolated voltage waveform may be substantially complementary with the voltage waveform observed during the first portion half-cycle. The voltage drop across the load 506 during the second portion of the half-cycle while the controllably conductive device is on may be estimated using the extrapolated voltage waveform.

At 812, a power consumed by the load 506 during the second portion of the half-cycle may be calculated. For example the controller 510 may calculate the power consumption of the load 506 by multiplying the current through the two-wire load control device 502 during the second portion of the half-cycle by the estimated voltage drop across the load 506 during the second portion of the half-cycle. The calculated power consumption of the load 506 during the second portion of the half-cycle may be representative of a real-time estimated power consumption of the load 506.

At 814, the power consumption of the load 506 during the second portion of the half-cycle may be reported as a real-time estimate of the power consumption of the load 506. Reporting the real-time estimate of the power consumption of the load 506 may comprise the controller 510 causing the real-time estimate of the power consumption of the load 506 to be displayed via the user interface 524, the controller 510 causing the real-time estimate of the power consumption of the load 506 to be communicated to one or more devices external to the two-wire load control device 502 via the communication circuit 526, or otherwise reporting the real-time estimate of the power consumption of the load 506, in any combination. For example, the controller 510 may cause the real-time estimate of the power consumption of the load 506 to be communicated to a central controller or transmitter, a lighting management system, an information tracking system, an energy management system (EMS), a communication device associated with a user of the two-wire load control device 502 (e.g., a smart phone, computer, etc.), or the like. An example of a central controller for a load control system is described in greater detail in commonly-assigned U.S. Patent Application No. 61/654,562, filed Jun. 1, 2012, entitled "Load Control System Having Independently-Controlled Units Responsive to a Broadcast Transmitter", the entire disclosure of which is hereby incorporated by reference.

The real-time estimate of the power consumption of the load 506 may be reported substantially instantaneously (e.g., on demand), in response to a request received by the controller 510 via the user interface 524 and/or the communication circuit 526. For example, the controller 510 may receive a query (e.g., a broadcast generated by a lighting control system) to report the average power consumption of the load 506. Additionally, real-time estimates of the power consumption of the load 506 may be calculated and/or reported in accordance with one or more periodic reporting schemes.

The controller may be configured to repeatedly perform the method 800 for measuring and reporting of a power consumption of the load 506 in accordance with the periodic reporting scheme. In this regard, the controller 510 may calculate multiple instances (e.g., a plurality of instances) of real-time estimates of the power consumption of the load 506 in accordance with a pre-determined interval. For example the controller may calculate real-time estimates of the power consumption of the load 506 on a half-cycle-to-half-cycle basis (e.g., approximately every 8.3 milliseconds), or in accordance with any other suitable pre-determined interval. The controller 510 may accumulate the plurality of instances of the real-time estimates of the power consumption of the load 506 and/or may store the plurality of instances of the real-time estimates of the power consumption of the load 506 in the memory 512.

As described above, the controller 510 may calculate average power. The controller 510 may cause the average real-time estimate of the power consumption of the load 506 to be reported periodically in accordance with a periodic reporting scheme, for example in four (4) minute intervals, in fifteen (15) minute intervals, once every half hour, or in accordance with any other periodic reporting scheme as desired. A frequency with which the real-time estimates of the power consumption of the load 506 are reported may be varied. For example, the frequency of reporting may be increased or decreased when demand for power in one or more section of the power grid reaches crosses a pre-determined threshold.

It should be appreciated that the controller 510 may comprise a processor adapted to carry out one or more steps of the above-described method 800. The method and apparatuses for measurement and/or reporting of the power consumption of a load controlled by a two-wire load control device described above may be adapted for use in reverse-phase-control load control systems.

What is claimed:

1. A two-wire lighting control device for controlling an amount of power delivered from an alternating current (AC) power source to a lighting load, the two-wire lighting control device comprising:
   a controllably conductive device configured to be coupled in series electrical connection between the AC power source and the lighting load;
   a control circuit configured to render the controllably conductive device non-conductive during a first portion of a half-cycle of an AC waveform and render the controllably conductive device conductive during a second portion of the half-cycle to control the amount of power delivered to the lighting load;
   a voltage measuring circuit configured to measure a voltage across the two-wire lighting control device during the first portion of the half-cycle;
   a signal generator configured to generate a complementary voltage waveform that approximates a voltage across the lighting load during the second portion of the half-cycle, wherein the complementary voltage waveform is based on the voltage measured across the two-wire lighting control device during the first portion of the half-cycle; and
   a current measuring circuit configured to measure a current supplied to the lighting load from the two-wire load control device during the second portion of the half-cycle;
   wherein the control circuit is further configured to compute an estimated amount of power consumed by the lighting load based on the complementary voltage waveform and the current supplied to the lighting load during the second portion of the half-cycle.

2. The two-wire lighting control device of claim 1, further comprising a communication circuit, wherein the communication circuit is adapted to report the estimated power consumed by the lighting load.

3. The two-wire lighting control device of claim 2, wherein the estimated power consumed by the lighting load is reported periodically.

4. The two-wire lighting control device of claim 2, wherein the estimated power consumed by the lighting load is reported upon crossing a pre-determined threshold.

5. The two-wire lighting control device of claim 1, wherein the voltage measuring circuit comprises a voltage divider.

6. The two-wire lighting control device of claim 1, wherein the current measuring circuit comprises a micro-ohm resistor.

7. The two-wire lighting control device of claim 1, further comprising a user interface having a display.

8. The two-wire lighting control device of claim 1, wherein a voltage drop is measured during the first portion of the half-cycle.

9. The two-wire lighting control device of claim 1, wherein a voltage drop is estimated during the second portion of the half-cycle.

10. A two-wire lighting control device for controlling an amount of power delivered from an alternating current (AC) power source to a lighting load, the load control device comprising:
    a controllably conductive device configured to be coupled in series electrical connection between the AC power source and the lighting load; and
    a control circuit configured to:
       control the amount of power delivered to the lighting load by rendering the controllably conductive device non-conductive during a first portion of a half-cycle of an AC waveform and rendering the controllably conductive device conductive during a second portion of the half-cycle;
       measure a voltage across the two-wire lighting control device during the first portion of the half-cycle;
       compute an estimated voltage across the load during a second portion of the half-cycle based on the voltage measured across the two-wire lighting control device during the first portion of the half-cycle;
       measure a current supplied to the lighting load during the second portion of the half-cycle; and
       compute, based on the estimated voltage and the measured current, an estimated power consumed by the lighting load during the second portion of the half-cycle.

11. The two-wire lighting control device of claim 10, wherein the control circuit is further adapted to report the estimated power consumed by the load via a communication circuit.

12. The two-wire lighting control device of claim 10, wherein the estimated voltage has a step-sine waveform.

13. The two-wire lighting control device of claim 10, wherein the estimated voltage has a square waveform.

14. The two-wire lighting control device of claim 10, wherein the two-wire lighting control device comprises a dimmer.

15. The two-wire lighting control device of claim 10, wherein the controllably conductive device comprises a triac.

16. The two-wire lighting control device of claim 10, wherein the control circuit is configured to control the controllably conductive device using forward phase control to control the amount of power delivered to the lighting load.

17. A method for estimating power consumption of a lighting load using a two-wire lighting control device, the two-wire lighting control device configured to control an amount of power delivered from an alternating current (AC) power source to the lighting load, the lighting control device having a controllably conductive device that is configured to operate in a non-conductive state during a first portion of a half-cycle of an AC waveform and in a conductive state during a second portion of the half-cycle, the method comprising:

measuring a voltage across the two-wire lighting control device during a first portion of the half-cycle;

computing an estimated voltage across the lighting load during a second portion of the half-cycle based on the voltage measured across the two-wire lighting control device during the first portion of the half-cycle;

measuring a current supplied to the lighting load during the second portion of the half-cycle; and computing, based on the estimated voltage and the measured current, an estimated power consumed by the lighting load during the second portion of the half-cycle.

18. The method of claim 17, further comprising reporting the estimated amount of power consumed by the lighting load.

19. The method of claim 17, wherein computing the estimated voltage across the lighting load during the second portion of the half-cycle comprises generating a complementary voltage waveform that approximates the voltage across the lighting load during the second portion of the half-cycle.

20. The method of claim 19, wherein the complementary voltage waveform is based on the voltage measured across the two-wire load control device during the first portion of the half-cycle, and the complementary voltage waveform comprises a step-sine waveform or a square waveform.

* * * * *